(12) United States Patent
Adamec

(10) Patent No.: US 8,101,911 B2
(45) Date of Patent: Jan. 24, 2012

(54) METHOD AND DEVICE FOR IMPROVED ALIGNMENT OF A HIGH BRIGHTNESS CHARGED PARTICLE GUN

(75) Inventor: Pavel Adamec, Haar (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 272 days.

(21) Appl. No.: 12/264,848

(22) Filed: Nov. 4, 2008

(65) Prior Publication Data
US 2010/0108904 A1    May 6, 2010

(51) Int. Cl.
*H01J 37/20* (2006.01)
(52) U.S. Cl. .............. 250/310; 250/398; 250/396 R
(58) Field of Classification Search .............. 250/310
See application file for complete search history.

(56) References Cited

U.S. PATENT DOCUMENTS

| | | | | |
|---|---|---|---|---|
| 5,650,628 | A * | 7/1997 | Gordon et al. | 250/398 |
| 5,852,297 | A * | 12/1998 | Ishitani et al. | 250/492.21 |
| 6,452,175 | B1 * | 9/2002 | Adamec | 250/310 |
| 7,820,978 | B2 * | 10/2010 | Goto | 250/396 R |

FOREIGN PATENT DOCUMENTS

| | | |
|---|---|---|
| EP | 0 999 573 | 5/2000 |
| EP | 1 830 385 | 9/2007 |

OTHER PUBLICATIONS

Extended European Search Report dated Feb. 5, 2009 for European Application No. 08168306.2.
V.N. Tondare article, "Quest for High Brightness, Monochromatic Noble Gas Ion Sources." J. Vac. Sci. Technol. A 23(6), Nov./Dec. 2005, pp. 1498-1508.
Wilbertz et al article, "A Focused Gas-Ion Beam System for Submicron Application." 1992, Elsevier Science Publishers B.V., pp. 120-124.
Wilbertz et al article, "Recent Progress in Gas Field Ion Source Technology." Proceedings of the Society of Photo-Optical Instrumentation, SPIE vol. 2194, pp. 407-417.

* cited by examiner

*Primary Examiner* — Phillip A Johnston
(74) *Attorney, Agent, or Firm* — Patterson & Sheridan, L.L.P.

(57) ABSTRACT

A charged particle gun alignment assembly for emitting a charged particle beam along an optical axis of a charged particle beam device is described. The charged particle gun alignment assembly is configured to compensate for misalignment of the charged particle beam and includes a charged particle source having an emitter with a virtual source defining a virtual source plane substantially perpendicular to the optical axis; a condenser lens for imaging the virtual source; a final beam limiting aperture adapted for shaping the charged particle beam; and a double stage deflection assembly positioned between the condenser lens and the final beam limiting aperture, wherein the working distance of the condenser lens is 15 mm or less.

24 Claims, 3 Drawing Sheets

METHOD AND DEVICE FOR IMPROVED ALIGNMENT OF A HIGH BRIGHTNESS CHARGED PARTICLE GUN

FIELD OF THE INVENTION

Embodiments of the present invention relate to a method and an apparatus for the examination of a specimen with a beam of charged particles. In particular, they relate to an apparatus and a method for imaging or structuring a specimen with a charged particle beam from a high brightness charged particle beam source. Specifically, embodiments relate to a charged particle gun alignment assembly, a charged particle beam device, a method of aligning a charged particle beam of a charged particle gun and a method of operating a charged particle beam device.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring is often done with charged particle beams, e.g., electron beams, which are generated and focused in charged particle beam devices, such as electron microscopes or electron beam pattern generators. Charged particle beams offer superior spatial resolution compared to, e.g., photon beams, due to their short wavelengths.

For charged particle beam systems such as a scanning electron microscope (SEM) the brightness of the electron gun is becoming increasingly important. Thereby, the virtual size of the source, i.e., the size of the portion of the emitter tip that is imaged, can be used to improve the brightness of the charged particle source. However, this may result in an increasingly complex alignment of the charged particle beam with respect to the optical axis. Thus, there is a need for an improved alignment of a charged particle beam to an optical axis, particularly for high brightness charged particle sources.

SUMMARY OF THE INVENTION

In light of the above, in at least one embodiment the present invention intends to provide an improved charged particle beam device, an improved method of operating a charged particle beam device, and a method of manufacturing the charged particle device.

According to one embodiment a charged particle beam device for scanning a charged particle beam over a specimen is provided. The charged particle beam device includes a charged particle gun alignment assembly for emitting the charged particle beam along an optical axis of the charged particle beam device, the charged particle gun alignment assembly being configured to compensate for misalignment of the charged particle beam. The gun alignment assembly includes a charged particle source having an emitter with a virtual source defining a virtual source plane substantially perpendicular to the optical axis, a condenser lens for imaging the virtual source, a final beam limiting aperture adapted for shaping the charged particle beam, and a double stage deflection assembly positioned between the condenser lens and the final beam limiting aperture, wherein the working distance of the condenser lens is 15 mm or less. The charged particle beam device further includes an objective lens for focusing the charged particle beam on the specimen which can be placed on a specimen location, the objective lens being disposed on a first side of the specimen location-and a detector for detecting secondary particles being disposed the first side of the specimen location.

According to one embodiment, a charged particle gun alignment assembly for emitting a charged particle beam along an optical axis of a charged particle beam device, the charged particle gun alignment assembly configured to compensate for misalignment of the charged particle beam is provided. The charged particle gun alignment assembly includes a charged particle source having an emitter with a virtual source defining a virtual source plane substantially perpendicular to the optical axis; a condenser lens for imaging the virtual source; a final beam limiting aperture adapted for shaping the charged particle beam; and a double stage deflection assembly positioned between the condenser lens and the final beam limiting aperture, wherein the working distance of the condenser lens is 15 mm or less.

According to a further embodiment, a method of aligning a charged particle beam of a charged particle gun is provided. The method includes generating a charged particle beam with an emitter having a virtual source for the charged particle beam; magnifying the virtual source with a condenser lens; and aligning the charged particle beam to a final beam limiting aperture with a first alignment stage and a second alignment stage, wherein the first alignment stage and the second alignment stage are positioned between the condenser lens and the final beam limiting aperture.

According to an even further embodiment, a method of operating a charged particle beam device is provided. The method includes generating a charged particle beam with an emitter having a virtual source for the charged particle beam; magnifying the virtual source with a condenser lens; and aligning the charged particle beam to a final beam limiting aperture by a first alignment stage and a second alignment stage, wherein the first alignment stage and the second alignment stage are positioned between the condenser lens and the beam limiting aperture. The method further includes demagnifying an image of the virtual source of the emitter with an objective lens on a specimen.

Further advantages, features, aspects and details that can be combined with the above embodiments are evident from the dependent claims, the description and the drawings.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments are also directed to methods by which the described apparatus operates. It includes method steps for carrying out every function of the apparatus or manufacturing every part of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DESCRIPTION OF THE PREFERRED EMBODIMENTS

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following the charged particle beam device or components thereof will exemplarily be referred to as a charged particle beam device including the detection of secondary electrons. The present invention can still be applied for apparatuses and components detecting corpuscles such as secondary and/or backscattered charged particles in the form of electrons or ions, photons, X-rays or other signals in order to obtain a specimen image. As described herein, reference to secondary particles can be understood as reference to any secondary and/or backscattered particles described herein.

Generally, when referring to corpuscles it is to be understood as a light signal, in which the corpuscles are photons, as well as particles, in which the corpuscles are ions, atoms, electrons or other particles.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other workpieces such as memory disks and the like. Embodiments of the invention may be applied to any workpiece on which material is deposited or which is structured. A specimen includes a surface to be structured or on which layers are deposited, an edge, and typically a bevel.

Figure 1A:
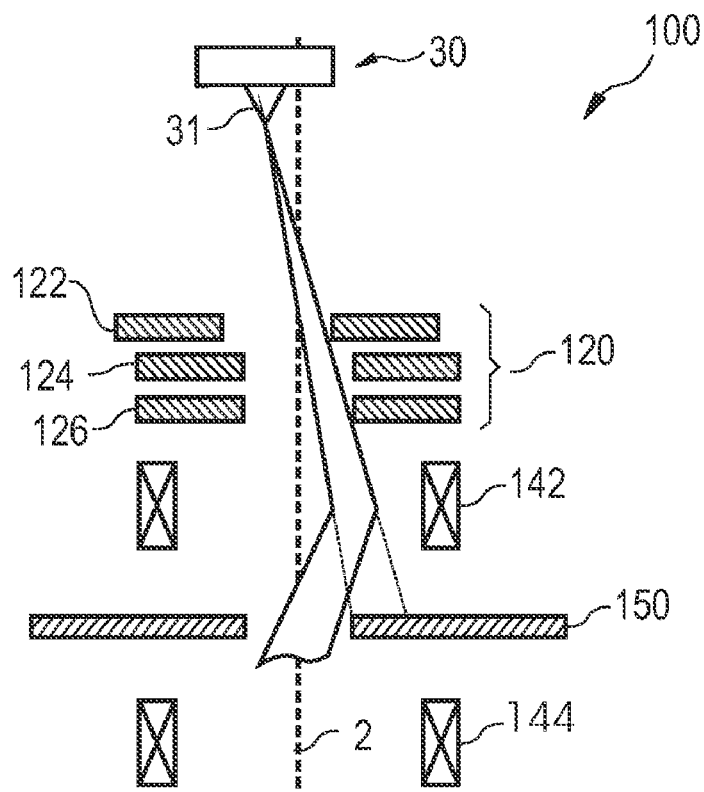
FIG. 1A shows an alignment of a charged particle beam with respect to a final aperture.

FIG. 1 shows an upper portion of a charged particle beam column 100. A charged particle source 30 has an emitter 31 for emitting the charged particle beam during operation of the charged particle beam column. Typically, the virtual source size can be in a range of 15 to 20 nm. This may result in a spot size of 0.5 nm on a specimen if an objective lens demagnifies the image of the virtual source by a factor of, for example, 30. Typically, the working distance of an objective lens can be below 2 mm, such as about 1 mm, or even smaller. As shown in FIG. 1, a condenser lens 120 can be provided, for example, as an Einzel lens having electrodes 122, 124 and 126. As indicated in FIG. 1, the condenser lens has an error in the symmetry or the coaxiality which can typically be in a range of 5 to 30 μm, for example, 10 to 20 μm. This results in a misalignment of the emitted charged particle beam.

As shown in FIG. 1, the charged particle beam can as a result thereof be inclined with respect to the optical axis 2. A first alignment deflector 142 is provided above the final aperture 150 in order to align the charged particle beam with the final aperture 150. A second deflector 144 is provided below the final aperture 150 in order to correct the angle of the charged particle beam with respect to the optical axis 2 after the charged particle beam passes through the aperture. Accordingly, a two-stage alignment deflector assembly including a first alignment deflector 142 and second alignment deflector 144 is provided, wherein the final aperture 150 is provided between the first alignment deflector and second alignment deflector.

Typically, a high brightness of the charged particle source can be achieved by reducing the virtual source size. Thereby, the virtual source size can be understood as follows.

Figure 1B:
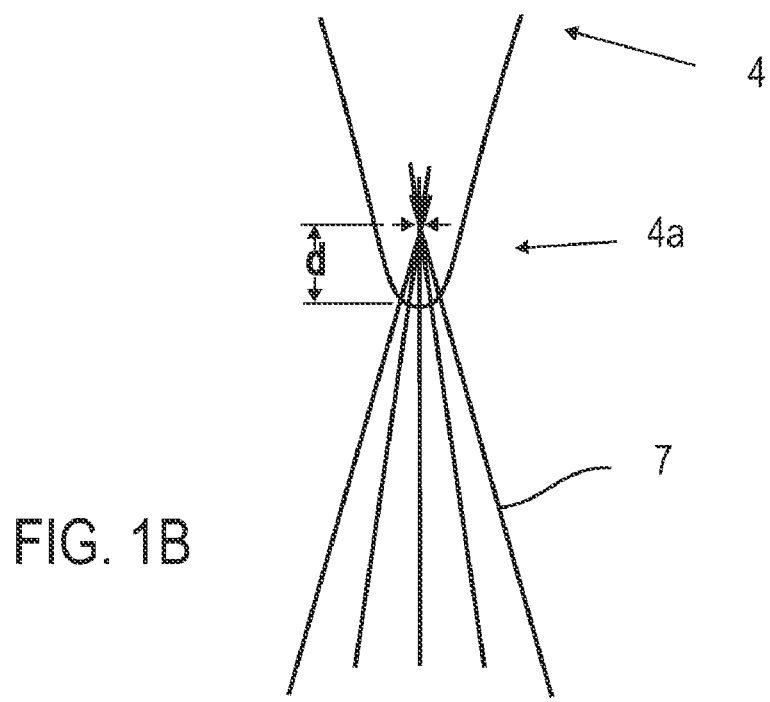
FIG. 1B illustrates the term virtual source size.

FIG. 1B shows a tip portion of an emitter 4. The tip thereby emits or generates the particle beam to thereby act as a particle beam source. Particularly for a small (virtual) size of the emitter tip, the geometry of the optical system has to be adapted. One example of an emitter is a cold field emitter (CFE) in electron-beam technology, which has a virtual source size of about 3 nm. But ion beam technology sources with small effective diameters are also known.

The virtual size might be better understood with reference to FIG. 1B. FIG. 1B shows the tip 4a of an emitter 4. Beams 7 are emitted from the emitter as indicated by the rays. These rays have a virtual emission source that is located at a distance d from the very end of emitter tip 4a. The virtual emission source is located within the emitter tip. Thereby, for some embodiments described herein, the virtual source size is referred to as the size of the region within the emitter tip 4a, from which the rays 7 seem to emerge.

As described above, a reduction of the virtual source size, which has been explained with respect to FIG. 1B, can be used when achieving a high brightness of the charged particle beam source. However, if the virtual source size is reduced from, for example 15 to 20 nm, to a virtual source size of 1 to 5 nm, typically 2 to 3 nm, a magnification or a higher magnification of the condenser lens is required in order to have a similar spot size on the specimen and, thereby, to effectively use the brightness of a charged particle beam source for high current applications.

Generally, for embodiments described herein, high current applications or systems can be referred having a reduced brightness of $10^7$ A/(eV·m$^2$·sr) or more, typically in a range of $5 \times 10^7$ A/(eV·m$^2$·sr) to $10^9$ A/(eV·m$^2$·sr), can be utilized for such applications or systems.

Figure 2:
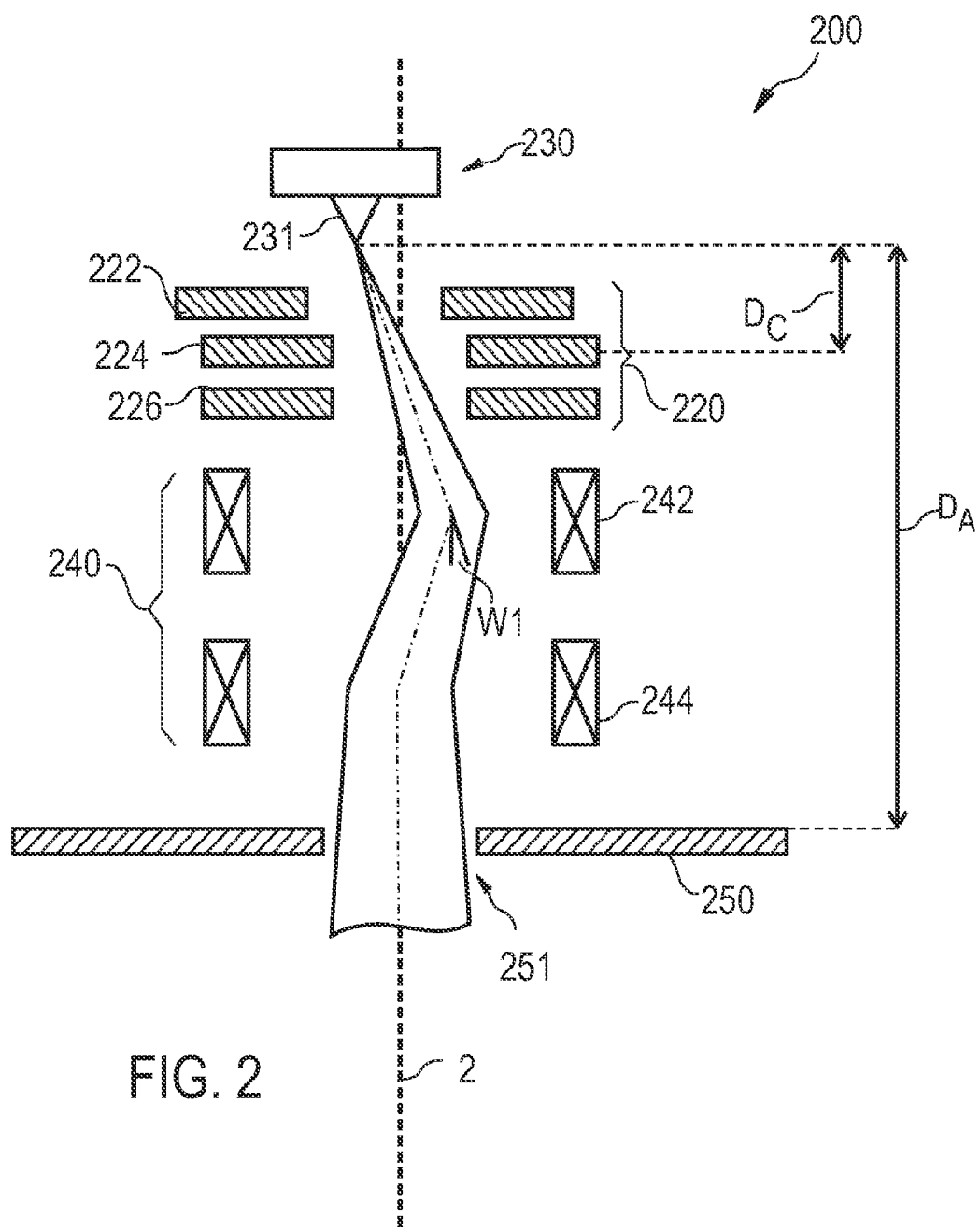
FIG. 2 shows an alignment assembly according to embodiments described herein, which can be used for charged particle beam devices.

In light of the magnification of the condenser lens, the working distance DC of the condenser lens 220 from the virtual source plane is reduced, as shown in FIG. 2. According to some embodiments, which can be combined with other embodiments described herein, the focal length of the condenser lens can be in a range of 2 to 5 mm, which can result in a working distance DC of less than 15 mm, for example, less than 5 mm. However, the coaxiality error of the condenser lens 220 is still similar as compared to the coaxiality error shown in FIG. 1. Thereby, the angle of inclination is increased and, according to some embodiments which can be combined with other embodiments described herein, the charged particle beam can leave the condenser lens under an angle of 0.5° or more. Accordingly, a charged particle beam may impinge on the final aperture at a distance of 1 mm or more in the absence of an alignment.

According to typical embodiments, which can be combined with other embodiments described herein, the charged particle beam is divergent from the source to the final beam limiting aperture. Thus even though the divergence might be changed by the condenser lens, the beam remains divergent between the condenser lens and the final beam limiting aperture.

The increased angle and distance from the optical axis results, however, in a more complex alignment, particularly if the mechanical position of the charged particle source 230 (30) is not known.

If a set of alignment deflectors 142 and 144 is provided as shown in FIG. 1, wherein the final aperture, i.e., the beam shaping aperture, is provided between the first alignment deflector 142 and the second alignment deflector 144, for the case of a large beam inclination there is a high likelihood that the beam passing through the final aperture will hit a further component or further aperture (which is not the beam shaping aperture) and an alignment of the charged particle beam for a large beam inclination is not possible.

Therefore, as shown in FIG. 2, a charged particle beam device 200 with an alignment deflector assembly 240 having a first alignment deflector 242 and second alignment deflector 244 is provided above the final aperture 250. That is, the alignment deflector assembly 240 having at least two alignment deflectors is provided between the charged particle source 230 and the final aperture 250. According to typical embodiments, which can be combined with other embodiments described herein, the alignment deflectors 242 and 244 can be electrostatic or magnetic. Thereby, according to yet further additional or alternative modifications, the alignment deflectors 242 and 244 are configured to have similar deflection characteristics such that aberrations, which might be introduced by the first alignment deflector 242, can be compensated for or at least partly compensated for by a second alignment deflector 244.

As shown in FIG. 2, typical embodiments described herein include a charged particle source 230 having an emitter 231, a condenser lens 220 and a final beam limiting aperture, i.e., a final aperture 250, as well as the alignment system, such as the deflector assembly 240, which is positioned between the final aperture 250 and the condenser lens 220. For example, the condenser lens can be provided as an Einzel lens having first to third electrodes, 222, 224, and 226. According to yet further embodiments, the charged particle source can be a high brightness charged particle or electron gun, like a Schottky emitter, especially a cold field emitter, a liquid ion emitter, a field ion emitter or a gas field ion source. Thereby, according to typical implementations, the virtual source size in a range of 1 nm to 5 nm can be realized in order to provide a high brightness charged particle gun. According to embodiments described herein, a high brightness electron gun is referred to as an electron gun having a reduced brightness of $10^7$ A/(eV·m²·sr) or more, typically in a range of $5 \times 10^7$ A/(eV·m²·sr) to $1 \times 10^9$ A/(eV·m²·sr).

In light of the symmetry error or coaxiality error of the condenser lens, the reduced working distance DC of the condenser lens, which is provided in light of the desired magnification of the condenser lens, results in large angles, under which the charged particle beam leaves the condenser lens 220. These angles can be about 0.3° or more. Typically, the angles can be 0.5° or more. This is indicated in FIG. 2 by angle W1. In order to improve alignment for such large inclination angles, a two-stage deflection system having a first alignment deflector 242 and a second alignment deflector 244 is disposed between the condenser lens and the final aperture. Thereby, according to typical embodiments, which can be combined with other embodiments described herein, both deflection stages are of the same type (magnetic or electrostatic) in order to eliminate or at least partly compensate for aberrations of the deflection stages.

Generally, within the embodiments depicted herein, for simplicity, only one dimension for alignment of the charged particle beam is shown in FIG. 2. However, embodiments described herein can include providing a first and second deflection stage for alignment in X-direction and alignment in Y-direction, wherein the Y-direction is defined by the optical axis 2 of the optical system. Thus, alignment can be conducted in a plane perpendicular to the optical axis.

According to yet further embodiments, which can be combined with other embodiments described herein, the field of the deflection system does not substantially overlap with the field of the condenser lens or does not substantially penetrate the opening 251 of the final aperture 250. Thereby, it is understood that not more than 10% of the deflection fields overlap with the field of the condenser lens and not more than 10% of the field of the deflection system penetrates the opening of the final aperture.

According to yet further embodiments, the two-stage deflection system can be positioned and operated such that the pivot point of the two-stage deflection system is in the virtual source plane of the charged particle source 230. That is, during operation of the alignment system, wherein the charged particle beam is moved with respect to the opening of the final beam limiting aperture, the charged particle beam is deflected by the combination of the first and the second stage such that for each combined deflection of the first and the second stage the beam seems to emerge on a straight path from the virtual source.

As shown in FIG. 2, the first electrode 222 of the condenser lens 220 is positioned below the emitter 231. Thereby, it is possible that the first electrode 222 is adapted to be the anode for the charged particle gun. The first electrode 222 of the condenser lens 220 is thereby in operation set at the desired potential for the anode potential of the charged particle beam system. According to further embodiments, which can be combined with embodiments described herein, a further anode might be provided between the emitter 231 and the condenser lens 220. This might, as one example, be applicable if the condenser lens 220 is provided as a magnetic lens. Generally, according to different embodiments, which can be combined with other embodiments described herein, the condenser lens can be provided as an electrostatic lens, a magnetic lens or a combined electrostatic magnetic lens.

With regard to the anode, different embodiments, which can be combined with other embodiments described herein, can be yielded by providing the anode with an anode aperture that is a beam limiting aperture. Thus, a first beam blanking can be conducted by the anode aperture, whereas a final beam blanking can be conducted by the final aperture.

As described above, the improved alignment system described herein is particularly applicable for high brightness applications. According to different embodiments, these applications may be defined by a magnification of the condenser lens. Thereby, according to different implementations, which might be combined with each other, the working distance DC can be less than 15 mm, typically less than 5 mm. The distance of the final aperture 150 to the emitter 231 can be in the range of 70 mm to 170 mm, for example 100 mm or 150 mm.

According to yet further embodiments, which can be combined with other embodiments described herein, typically the final aperture 250 is a fixed aperture, i.e., can not be moved with respect to the optical axis. This is to be understood that the aperture can still be replaced within the system for maintenance reasons or the like. However, the aperture has a predetermined operation position in the charged particle beam device, which has a fixed position relative to the optical axis. If for example a multi-aperture is provided, each opening 251 of a multi-aperture has a predetermined position with respect to the optical axis 2 in its operation position. That is, the opening for trespassing of the beam of the final beam limiting aperture is fixedly positioned during operation. Contrary thereto, typical implementations, which yield even further embodiments, which can be combined with other embodiments described herein, include the charged particle source to be mechanically positionable, i.e., the source can be aligned, with respect to the optical axis or the condenser lens. Accordingly, the position of the charged particle source can be adjusted in a plane essentially perpendicular to the optical axis.

Figure 3:
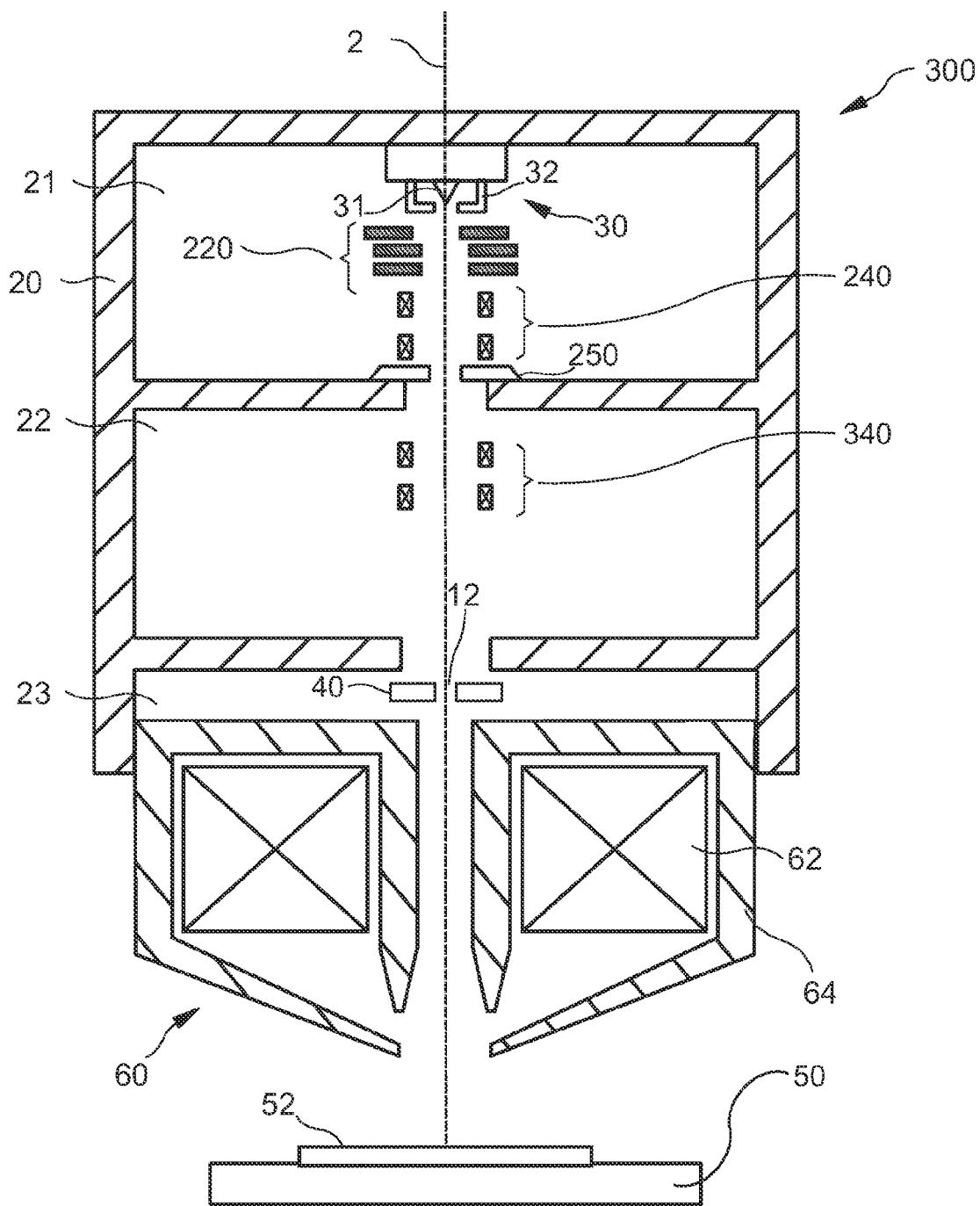
FIG. 3 shows a charged particle beam device illustrating further embodiments of an improved alignment of a high brightness charged particle beam described herein.

Further embodiments can be described with respect to FIG. 3. FIG. 3 shows a charged particle beam device 300. The charged particle beam column 20 provides a first chamber 21, a second chamber 22 and a third chamber 23. The first chamber, which can also be referred to as a gun chamber, includes the charged particle source 30 having an emitter 31 and a suppressor 32. A charged particle beam is generated by the charged particle beam source 30 and is aligned to the beam limiting aperture 250, which is dimensioned to shape the beam, i.e., blocks a portion of the beam, passes through opening 12 of the detector 40 and is focused on the specimen 52 positioned on a specimen position on the specimen stage 50. On impingement of the charged particle beam, for example, secondary or backscattered electrons are released from the specimen 50, which can be detected by the detector 40.

According to some embodiments, which can be combined with other embodiments described herein, a condenser lens 220 and a beam shaping or beam limiting aperture 250 are provided. The two-stage deflection system 240 is provided between the condenser lens and the beam shaping aperture 250 in order to improve alignment for high brightness applications and with the existing coaxiality error of the condenser lens.

According to yet further embodiments, which can be combined with other embodiments described herein, below the beam shaping aperture 250 a further alignment system 340 can be provided. According to even further embodiments, the further alignment system, which is positioned between the final aperture 250 and the objective lens 60 can be a single stage or a double-stage deflection system. As further alternatives, the further alignment system can be electrostatic or magnetic.

As shown in FIG. 3, according to some embodiments, a detector 40 can be provided above the objective lens such that the primary charged particle beam passes through the opening 12 in the detector. The objective lens 60 having pole pieces 62 and a coil 64 focuses the charged particle beam on a specimen 52, which can be positioned on a specimen stage 50.

In light of the above, according to different embodiments, which can be combined with other embodiments described herein, a two-stage alignment system is provided between the condenser lens and the final beam shaping or beam limiting aperture. Thereby, typically no further optical elements are provided between the deflection system 240 and the final aperture 250.

According to yet further alternative or additional modifications, the final aperture 250 is in a fixed, non-movable position with respect to the optical axis 2. Typically, as a further example, embodiments, which can be combined with other embodiments described herein, can be configured such that the distance in a direction of the optical axis from the final aperture to the emitter is about 170 mm or less; for example 150 mm or 100 mm or less. The deflection system can typically be dimensioned to compensate for deflections of more than 1 mm in the plane of the final aperture or to compensate beam inclinations with respect to the optical axis of 0.5° or more.

In light of the above, a plurality of different alternative modifications of embodiments is described herein. Thereby, according to one embodiment, a charged particle gun alignment assembly for emitting a charged particle beam along an optical axis of a charged particle beam device is provided, wherein the charged particle gun alignment assembly can be configured to compensate for misalignment of the charged particle beam. The alignment assembly includes a charged particle source having an emitter with a virtual source defining a virtual source plane substantially perpendicular to the optical axis; a condenser lens for imaging the virtual source; a beam limiting aperture adapted for shaping the charged particle beam; and a double stage deflection assembly positioned between the condenser lens and the beam limiting aperture, wherein the distance along the optical axis from the beam limiting aperture to the virtual source plane is about 170 mm or less.

According to another embodiment a charged particle beam device for scanning a charged particle beam over a specimen is provided. The charged particle beam device includes a charged particle gun alignment assembly for emitting the charged particle beam along an optical axis of the charged particle beam device, the charged particle gun alignment assembly being configured to compensate for misalignment of the charged particle beam. The gun alignment assembly includes a charged particle source having an emitter with a virtual source defining a virtual source plane substantially perpendicular to the optical axis; a condenser lens for imaging the virtual source; a final beam limiting aperture adapted for shaping the charged particle beam; and a double stage deflection assembly positioned between the condenser lens and the final beam limiting aperture, wherein the working distance of the condenser lens is 15 mm or less. The charged particle beam device further includes an objective lens for focusing the charged particle beam on the specimen, which can be placed on a specimen location, the objective lens being disposed on a first side of the specimen location; and a detector for detecting secondary particles being disposed the first side of the specimen location.

According to yet further embodiments, at one or more of the following implementations can be provided, the implementations consisting of the group of: the double stage deflection assembly has a first alignment stage and a second alignment stage; the distance along the optical axis from the final beam limiting aperture to the virtual source plane can be 170 mm or less, typically between 50 mm and 150 mm; the working distance of the condenser lens can be 5 mm or less; the optical axis can define a Z-direction wherein the double stage deflection assembly can include a first stage for deflecting the charged particle beam in X-direction and in Y-direction and a second stage for deflecting the charged beam in X-direction and in Y-direction; and the double stage deflection assembly can be electrostatic or magnetic. According to yet further embodiments, which can be combined with the above embodiments, the double stage deflection assembly can be adapted for compensating a misalignment of the charged particle beam having a distance of about 1 mm or more from the optical axis in the plane of the final beam limiting aperture; can be adapted for compensating a misalignment of the charged particle beam having a beam inclination of about 0.5° or more; and/or can be adapted to compensate for the one or more misalignments of the charged particle beam by being dimensioned to provide a deflection width per path length and beam energy of $2.5 \times 10^{-2}$ (1/keV) or more. Yet further modifications to yield further embodiments can be provided such that the charged particle beam can include a further alignment deflection system positioned on the opposing side of the final beam limiting aperture as compared to the double stage deflection assembly; such that an opening for trespassing of the beam of the final beam limiting aperture can be fixedly positioned during operation; such that the charged particle source can be a source selected from the group consisting of: a cold field emitter type source, a cold field emitter, a Schottky emitter, a liquid ion source, a field ion emitter; and a gas field ion source; such that the charged particle beam source can be mechanically aligned in the virtual source plane with respect to the condenser lens; such that the condenser lens can be positioned and configured such that the charged particle beam is divergent from the charged particle beam source to the final beam limiting aperture; such that the charged particle beam device further may include an anode aperture, wherein the anode aperture is a beam limiting aperture; and/or such that the objective lens can have a working distance from the specimen location of 2 mm or less.

According to an even further embodiment, a method of aligning a charged particle beam of a charged particle gun is provided. The method includes generating a charged particle beam with an emitter having a virtual source for the charged particle beam; magnifying the virtual source with a condenser lens; and aligning the charged particle beam to a final beam limiting aperture by a first alignment stage and a second alignment stage, wherein the first alignment stage and the second alignment stage are positioned between the condenser lens and the final beam limiting aperture. According to different embodiments, which can be combined with other embodiments described herein, the condenser lens can be operated at a working distance of 15 mm or less, typically of 5 mm or less; in a system for which the optical axis defines a Z-direction, the charged particle beam can be aligned in the X-direction and the Y-direction; the aligning can shift the charged particle beam by about 1 mm or more in the plane of the final beam limiting aperture; the aligning can deflect the charged particle beam by about 0.5° or more; the first alignment stage and the second alignment stage may deflect the charged particle beam by a deflection width per path length and beam energy of $2.5\times10^{-2}$ (1/keV) or more; a further aligning, which may be conducted subsequent of said aligning, can be conducted after the charged particle beam has trespassed the final beam limiting aperture; and/or the charged particle beam can have a reduced brightness of $10^7$ A/(eV·m²·sr) or more.

In light of the above, embodiments as described herein provide an arrangement which is capable of a more effective and accurate alignment as compared to common SEM tools. Thereby, the complexity of the alignment system is not increased and it might be possible that a more compact charged particle beam column can be provided.

While the foregoing is directed to embodiments of the invention, other and further embodiments of the invention may be devised without departing from the basic scope thereof, and the scope thereof is determined by the claims that follow.

The invention claimed is:

1. A charged particle beam device for scanning a charged particle beam over a specimen, the charged particle beam device comprising:
   a charged particle gun alignment assembly for emitting the charged particle beam along an optical axis of the charged particle beam device, the charged particle gun alignment assembly being configured to compensate for misalignment of the charged particle beam and comprising:
      a charged particle source having an emitter with a virtual source defining a virtual source plane substantially perpendicular to the optical axis;
      a condenser lens for imaging the virtual source;
      a final beam limiting aperture adapted for shaping the charged particle beam; and
      a double stage deflection assembly positioned between the condenser lens and the final beam limiting aperture, wherein the working distance of the condenser lens is 15 mm or less, wherein not more than 10 percent of the fields of the double stage deflection assembly overlap with the field of the condenser lens;
   an objective lens for focusing the charged particle beam on the specimen, which can be placed on a specimen location, the objective lens being disposed on a first side of the specimen location; and
   a detector for detecting secondary particles being disposed on the first side of the specimen location.

2. The charged particle beam device according to claim 1, wherein the distance along the optical axis from the final beam limiting aperture to the virtual source plane is 170 mm or less.

3. The charged particle beam device according to claim 1, wherein the working distance of the condenser lens is 5 mm or less.

4. The charged particle beam device according to claim 1, wherein the optical axis defines a Z-direction and wherein the double stage deflection assembly comprises:
   a first stage for deflecting the charged particle beam in an X-direction and in a Y-direction; and
   a second stage for deflecting the charged beam in the X-direction and in the Y-direction.

5. The charged particle beam device according to claim 1, wherein the double stage deflection assembly is electrostatic.

6. The charged particle beam device according to claim 1, wherein the double stage deflection assembly is magnetic.

7. The charged particle beam device according to claim 1, wherein the double stage deflection assembly is adapted for compensating a misalignment of the charged particle beam having a distance of about 1 mm or more from the optical axis in the plane of the final beam limiting aperture.

8. The charged particle beam device according to claim 1, wherein the double stage deflection assembly is adapted for compensating a misalignment of the charged particle beam having a beam inclination of about 0.5° or more.

9. The charged particle beam device according to claim 8, wherein the double stage deflection assembly is adapted to compensate for the misalignment of the charged particle beam by being dimensioned to provide a deflection width per path length and a beam energy of $2.5\times10^{-2}$ (1/keV) or more.

10. The charged particle beam device according to claim 1, further comprising a further alignment deflection system positioned on the opposing side of the final beam limiting aperture as compared to the double stage deflection assembly.

11. The charged particle beam device according to claim 1, wherein an opening for trespassing of the beam of the final beam limiting aperture is fixedly positioned during operation.

12. The charged particle beam device according to claim 1, wherein the charged particle source is a source selected from the group consisting of: a cold field emitter type source, a cold field emitter, a Schottky emitter, a liquid ion source, a field ion emitter, and a gas field ion source.

13. The charged particle beam device according to claim 1, wherein the charged particle beam source is mechanically alignable in the virtual source plane with respect to the condenser lens.

14. The charged particle beam device according to claim 1, wherein the condenser lens is positioned and configured such that the charged particle beam is divergent from the charged particle beam source to the final beam limiting aperture.

15. The charged particle beam device according to claim 1, further comprising an anode aperture, wherein the anode aperture is a beam limiting aperture.

16. The charged particle beam device according to claim 1, wherein the objective lens has a working distance from the specimen location of 2 mm or less.

17. A method of aligning a charged particle beam of a charged particle gun, the method comprising:
  generating the charged particle beam with an emitter having a virtual source for the charged particle beam;
  magnifying the virtual source with a condenser lens; and
  aligning the charged particle beam to a final beam limiting aperture with a first alignment stage and a second alignment stage, wherein the first alignment stage and the second alignment stage form a double stage deflection assembly positioned between the condenser lens and the final beam limiting aperture, and wherein not more than 10 percent of the fields of the double stage deflection assembly overlap with the field of the condenser lens.

18. The method according to claim 17, wherein the condenser lens is operated at a working distance of 15 mm or less.

19. The method according to claim 17, wherein an optical axis defines a Z-direction and the charged particle beam is aligned in an X-direction and a Y-direction.

20. The method according to claim 17, wherein the aligning shifts the charged particle beam by about 1 mm or more in a plane of the final beam limiting aperture.

21. The method according to claim 20, wherein the aligning deflects the charged particle beam by about 0.5° or more.

22. The method according to claim 17, wherein the first alignment stage and the second alignment stage deflect the charged particle beam by a deflection width per path length and beam energy of $2.5 \times 10^{-2}$ (1/keV) or more.

23. The method according to claim 17, wherein a further aligning, which is conducted subsequent of the aligning, is conducted after the charged particle beam has trespassed the final beam limiting aperture.

24. The method according to claim 17, wherein the charged particle beam has a brightness of $10^7$ A/(eV·m²·sr) or more.

* * * * *